United States Patent
Giambrone et al.

(10) Patent No.: US 12,027,809 B2
(45) Date of Patent: Jul. 2, 2024

(54) VEHICLE INVERTER SEALING ARRANGEMENT

(71) Applicant: BORGWARNER LUXEMBOURG AUTOMOTIVE SYSTEMS SA, Bascharage (LU)

(72) Inventors: Lucas Giambrone, Haucourt-Moulaine (FR); Rodrigue Berhin, Arlon (BE)

(73) Assignee: BORGWARNER LUXEMBOURG AUTOMOTIVE SYSTEMS SA, Bascharage (LU)

( * ) Notice: Subject to any disclaimer, the term of this patent is extended or adjusted under 35 U.S.C. 154(b) by 391 days.

(21) Appl. No.: 17/607,433

(22) PCT Filed: Apr. 21, 2021

(86) PCT No.: PCT/EP2021/060343
§ 371 (c)(1),
(2) Date: Oct. 29, 2021

(87) PCT Pub. No.: WO2021/214121
PCT Pub. Date: Oct. 28, 2021

(65) Prior Publication Data
US 2022/0209437 A1    Jun. 30, 2022

(30) Foreign Application Priority Data
Apr. 22, 2020    (GB) .................................... 2005841

(51) Int. Cl.
*H01R 9/22*    (2006.01)
*B60R 16/02*    (2006.01)
(Continued)

(52) U.S. Cl.
CPC ............. *H01R 9/223* (2013.01); *B60R 16/02* (2013.01); *H02M 7/003* (2013.01); *H02K 5/10* (2013.01); *H02K 5/225* (2013.01)

(58) Field of Classification Search
CPC . H01R 9/223; H01R 9/22; H01R 9/20; H01R 9/18; H01R 9/16; B60R 16/02; H02M 7/003; H02K 5/10; H02K 5/225
See application file for complete search history.

(56) References Cited

U.S. PATENT DOCUMENTS 3,663,024 A * 5/1972 Traub ................... F16J 15/3208
                                                    277/910
5,171,027 A * 12/1992 Domkowski ........... F16H 57/08
                                                    277/400
(Continued)

FOREIGN PATENT DOCUMENTS

CN        107834266 A     3/2018
EP          1544585 A2    6/2005
(Continued)

OTHER PUBLICATIONS

International Search Report and Written Opinion mailed Jul. 23, 2021 in International Application No. PCT/EP2021/060343 (13 pages).

*Primary Examiner* — Harshad C Patel
(74) *Attorney, Agent, or Firm* — Joshua M. Haines; Bookoff McAndrews, PLLC

(57) ABSTRACT

A vehicle inverter terminal sealing arrangement comprising a electrical terminal of said inverter sealed into an inverter and having a distal portion of said terminal protruding external to said inverter, wherein said terminal is sealed into said inverter by means of a resilient peripheral seal, said peripheral seal surrounding a portion said terminal, and said seal being wedged between said terminal and at least one portion of said inverter.

20 Claims, 5 Drawing Sheets

(51) Int. Cl.
*H02M 7/00* (2006.01)
*H02K 5/10* (2006.01)
*H02K 5/22* (2006.01)

(56) References Cited

U.S. PATENT DOCUMENTS

| | | | | |
|---|---|---|---|---|
| 7,077,676 | B2* | 7/2006 | Matsumoto | H01R 13/521 |
| | | | | 439/271 |
| 8,128,431 | B2* | 3/2012 | Kato | H01R 13/521 |
| | | | | 439/271 |
| 8,449,328 | B2* | 5/2013 | Ooki | H01R 13/504 |
| | | | | 525/70 |
| 8,905,784 | B2* | 12/2014 | Perotto | H01R 13/5202 |
| | | | | 439/587 |
| 9,048,551 | B2* | 6/2015 | Picaud | H01R 13/5205 |
| 10,062,974 | B2* | 8/2018 | Okamoto | H01R 4/34 |
| 10,717,401 | B2* | 7/2020 | Skalski | H02K 5/10 |
| 2011/0316373 | A1* | 12/2011 | Kobayashi | H01R 13/521 |
| | | | | 310/71 |
| 2012/0184123 | A1* | 7/2012 | Fukuda | H01R 13/639 |
| | | | | 439/271 |
| 2013/0153292 | A1* | 6/2013 | Adachi | H01B 7/009 |
| | | | | 174/70 R |
| 2018/0304835 | A1 | 10/2018 | Skalski | |
| 2019/0104634 | A1* | 4/2019 | Hasija | H05K 5/069 |

FOREIGN PATENT DOCUMENTS

| | | |
|---|---|---|
| EP | 2 475 236 A2 | 7/2012 |
| EP | 2 498 384 A1 | 9/2012 |
| EP | 2 897 276 A2 | 7/2015 |
| EP | 3 462 544 A1 | 4/2019 |
| GB | 2492497 A | 1/2013 |
| WO | 2007095975 A1 | 8/2007 |

* cited by examiner

*Prior Art*

VEHICLE INVERTER SEALING ARRANGEMENT

CROSS-REFERENCE TO RELATED APPLICATIONS

This patent application is a National Stage Application of and claims the benefit of priority to International Patent Application No. PCT/EP2021/060343, filed on Apr. 21, 2021, which claims the benefit from GB Application No. 2005841.8, filed Apr. 22, 2020.

TECHNICAL FIELD

This relates to inverters used in electrical vehicles and specifically to means and arrangements to seal electrical connectors or terminals (such as pins and bus bars) thereof, to prevent ingress of fluids and/or particles to the inverter.

BACKGROUND OF THE INVENTION

An inverter is a device that converts DC power to the AC power used in an electric vehicle motor. The inverter can change the speed at which the motor rotates by adjusting the frequency of the alternating current. It can also increase or decrease the power or torque of the motor by adjusting the amplitude of the signal. Typically, the inverter has electrical terminals in the form of bus bars or pins which protrude from the inverter for suitable connection to components external of the inverter.

It is critical that there is no flow of any fluid into the inverter such as oil, fuel or water. Hence there is a need for the terminals to be formed with a fluid-tight connection; i.e. a sealed connection. The current state of the art to avoid any contamination or extra liquid flowing into the inverter through the connector (to avoid damage to the inverter and potentially lose control of the vehicle) is to use a dispense/sealing material to seal the pin or the bus bar. The dispense material is expensive because basic silicone cannot be used and flourosilicone is required which is more expensive. Furthermore the process of using such dispense material in fabrication is that it is a long process as curing time is required. It is also difficult to control the quality of the sealant/dispense material filling and the adhesion of the plastic/busbar to get a it good enough for the vehicle life. Also at the end of the assembly line a leak test is also required to evaluate the leak level and if the part fail it is not possible to reuse the parts.

There is a customer requirement that there is no leak path from the outside so as not to damage the inverter (short circuit by the particles/performance reduced by machine oil). As mentioned basic silicone is not allowed to not damage the e-machine but fluorosilicone is allowed, so, the current design uses a standard process to seal as "dispense materials" to avoid leaks going between the plastic and the busbar into the inverter.

As mentioned, the two types of dispense materials are used for cost and function point of view are basic silicone and fluor silicone SIFEL2614 (expensive 1$/gram). There is a leak issue due to the non-adhesion of the dispense material to the plastic, busbar and to the other dispense material (high rejects/scraps). Several inverters were damaged during testing.

SUMMARY OF THE INVENTION

In one aspect is provided a vehicle inverter terminal sealing arrangement comprising a electrical terminal of said inverter sealed into an inverter and having a distal portion of said terminal protruding external to said inverter, wherein said terminal is sealed into said inverter by means of a resilient peripheral seal, said peripheral seal surrounding a portion said terminal, and said seal being wedged between said terminal and at least one portion of said inverter.

Said at least one portion of said inverter may include a cut-away portion or slot through which the terminal protrudes externally, said seal being wedged between said terminal and the periphery of said cut away portion.

Said portion of the inverter may be the inverter housing.

Said portion of the inverter may be a ferrite core housing or housing component.

Said terminal may be a bus bar or pin of substantially rectangular cross section.

Said peripheral seal may be elongate.

Said seal may comprises a peripheral wall and such that varying thickness of the wall varies or the wall has a portion which is conical/tapered cross section.

Said seal may be wedged between said terminal and a first component of said invertor and also between said terminal and a second component of said invertor.

Said seal may be wedged between first component and second component of said invertor.

Said seal may be wedged between upper and lower ferrite core housings.

The portion of the upper ferrite core housing where the seal is wedged, may be the (bottom) surface of a central portion of the upper ferrite housing.

The seal may be wedged between upper ferrite core housing and portion of the inverter housing wall.

At least one or both of said first and second invertor components may include a slot portion through which the terminal protrudes, said seal being wedged between said terminal and the periphery of said cut away portion Any of said slots may include a recess or shoulder to receive or locate said seal wherein said portion of the inverter.

Said recess(es) or shoulder (s) may correspond substantially to the seal peripheral shape The arrangement may include spring means adapted to wedge, retain or place said seal under compression.

Said spring means comprises a spring clip.

The arrangement may include means to connect said first invertor component to said second inverter component; said connecting means acting also to compress said seal.

BRIEF DESCRIPTION OF THE DRAWINGS

The present invention is now described by way of example with reference to the accompanying drawings in which.

DESCRIPTION OF THE PREFERRED EMBODIMENTS

Figure 1A:
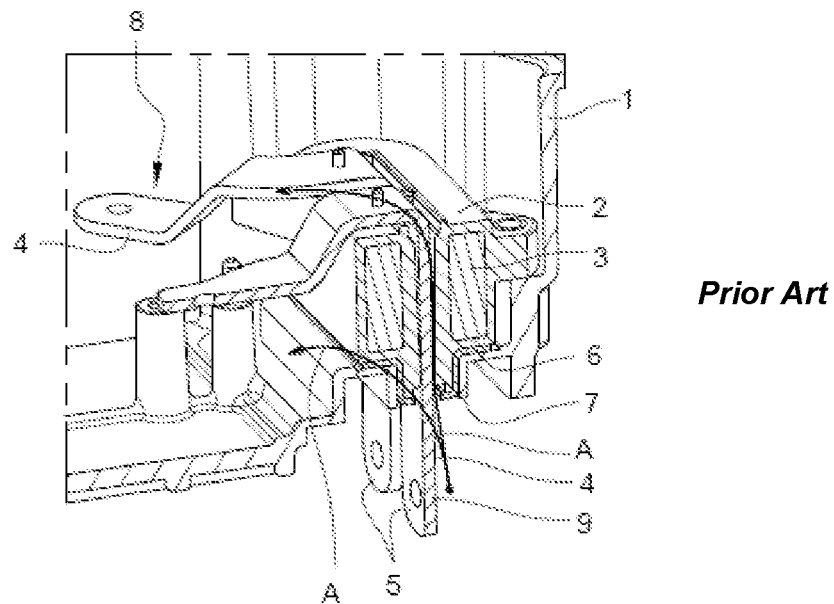
FIGS. 1a and b shows figures of an electric vehicle inverter showing a prior art sealing arrangement.

FIG. 1a shows a schematic Figure of a cut away portion of a known electric vehicle inverter showing the salient components. The Figure shows a prior art sealing arrangement. An (e.g. plastic) housing generally designated 2 may comprise an upper (plastic) housing 12 and a (lower) plastic housing 13, and is located onto the bottom/base portion 7 of the inverter (outer) housing designated with reference numeral 1.

Figure 1B:
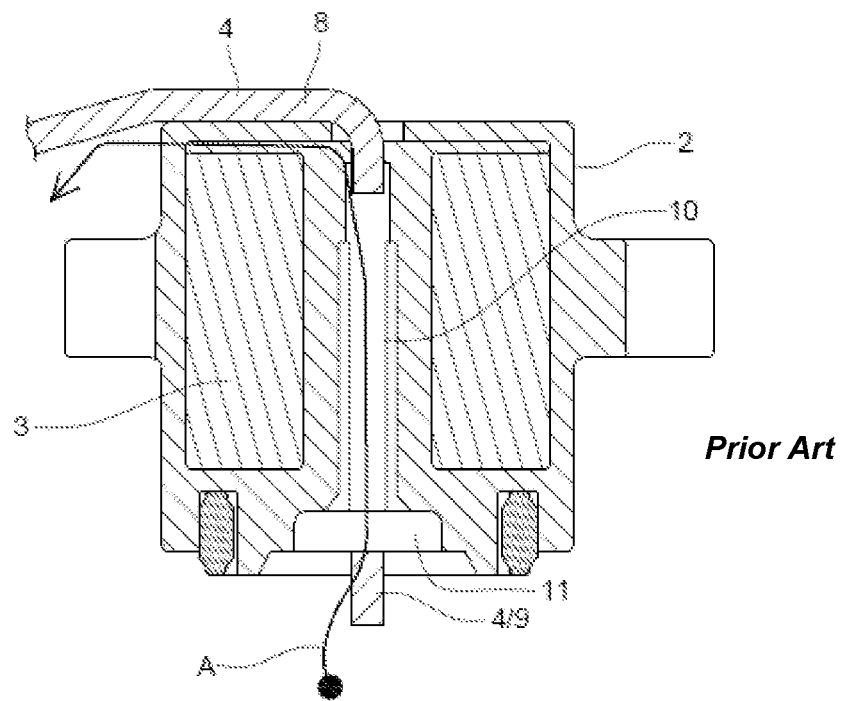

The plastic housings contains a ferrite core 3 so the upper and lower plastic housing has the ferrite inside. Terminal pins or bus bars are shown designated with reference numeral 4. These protrude i.e. extend from the internal portion of the inverter i.e. within the inverter housing, through the housing 2 to the exterior of the inverter at the bottom. The external/terminal ends of the pins/busbars are designated with reference numeral 5. There is a seal/sealing interface 6 between the lower plastic housing and the base 7 i.e. bottom of the inverter housing. The bus bar can be considered as comprising two portions a first (upper) portion 8 and a second (lower) portion 9, the latter which protrudes externally from the inverter GC and which needs to be sealed. The upper and lower housings 12 and 13 may be provided or considered as a single overmould housing FIG. 1b shows the ferrite core 3 in more detail and reference numerals designate the same components as FIG. 1a. The portions of the bus bar is embedded into the housing 2 using a first sealing/dispense material 10 (for e.g. the central portion of the bus bar), which may be silicone. A second dispense material 11 of flourosilicon is used to seal the lower (external portion) of the bus bar (4/9) to/within the lower portion of the overmould housing. As mentioned, the use of flourosilicon has problems such that it is expensive. Arrows A in both figures shows the possible leak paths.

Figure 2A:
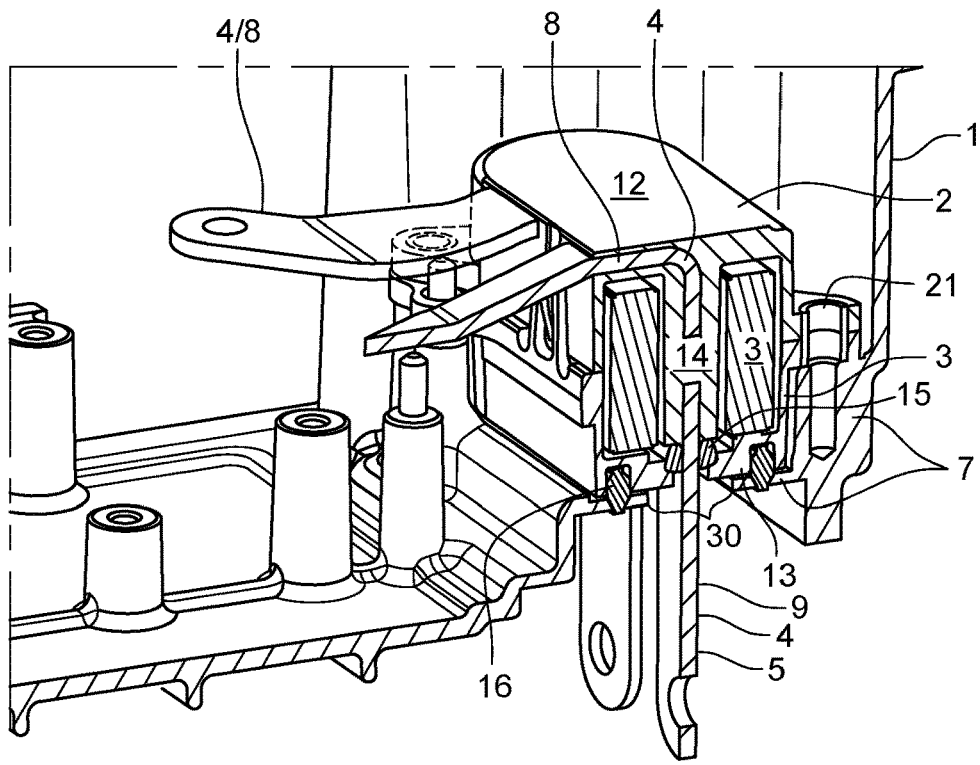
FIGS. 2a to 2e shows an example of an inverter sealing arrangement according to an example of the invention.

FIG. 2a shows a schematic view (a cross sectional view in a cut-away portion of the inverter housing) of one example of the invention. Again, reference numerals designate the same components as in the previous figures.

Figure 2B:
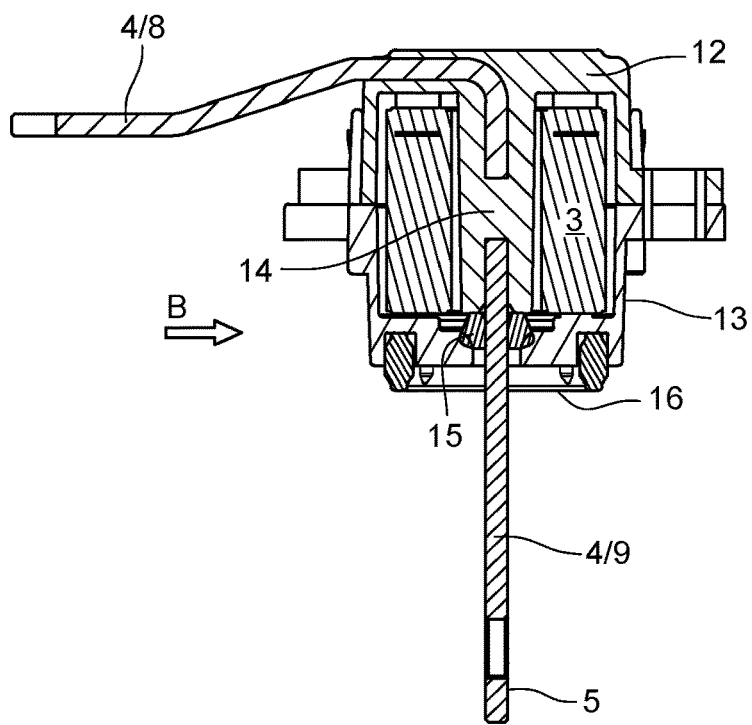
Figure 2C:
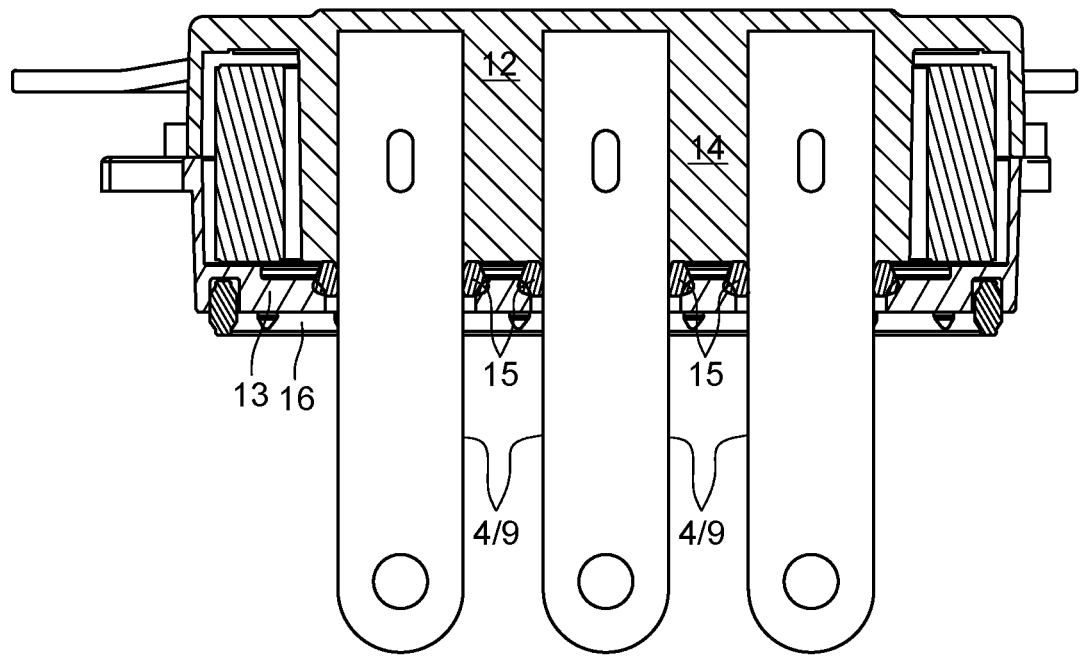

FIG. 2b shows a further cross sectional view of the arrangement of FIG. 2a and FIG. 2c shows a cross sectional view of the arrangement in the direction of arrow B of FIG. 2b. FIG. 2c shows a plurality of bus bars/terminal pins 4.

Figure 2D:
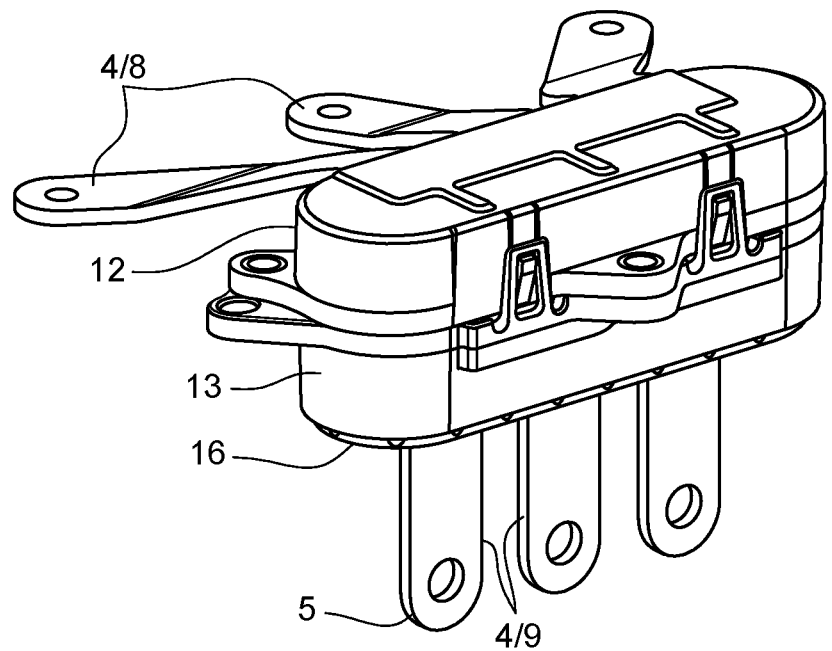

FIG. 2d shows the exterior of the arrangement. This shows an upper portion 12 of the ferrite housing 2 (fabricated from plastic) and the lower portion 13 thereof which may also be of plastic. The upper portion 12 is connected to the lower portion 13 by e.g. tapping and bolt/screw means 21, which also provides means to affix the arrangement of the overmould housing (including upper and lower portions (12,13 with the core 3)) to the lower wall 7 of the inverter housing. As can be seen in FIG. 2a the lower wall 30 of the inverter housing has a cut away portion to expose the lower wall of the lower ferrite housing portion. Thus here the distal end of the bus/bar terminal protrude externally directly from the assembly.

It should be noted that alternatively the bus bar may protrude externally from the inverter housing. Thus in an example it may be considered that the lower portion 13 of the overmould may be integral with i.e., formed by a portion of the lower wall of the inverter housing 7. In other words, there they may not be a separate lower portion component, and the exterior of the pin/bus bar 5/9 protrudes directly from the inverter wall externally.

A portion of the lower wall of the (lower) ferrite housing and/or the (bottom) wall of the inverter housing, where the seal is located preferably has one or more cut-away portions or slots through which the terminal ends 5 of respective bus bars/pins can protrudes to the exterior directly.

Preferably these cut away portions/slots include a slotted recess or other means to provide shoulder which assists in location of the seal.

The lower portion of the ferrite housing, i.e. the lower housing overmoulds the bus bar(s) as is shown in FIG. 2d.

The central portion of the upper portion/housing has reference numeral 14 in FIGS. 2b and 2c.

So in the examples e.g. of FIG. 2a-d, the first and second dispense material may be dispensed with. A seal 15 which will be explained in more detail hereinafter is shown in the FIGS. 2a to 2e. The seal surround the bus bar at the exposed end i.e. where it protrudes externally from the inverter (e.g. inverter housing/ferrite housing (end 5/9).

The seal in the example is wedged also between the upper and lower ferrite housings. Specifically here e.g. between bottom surface of the central portion of the upper ferrite housing, and the upper surface of the lower ferrite housing 13.

In general the seal which surrounds the bus bar/pin (referred generally as terminal) where the bus bar/pin (terminal) protrudes externally is wedged between the terminal and one or more components of the inverter (assembly). So a slot in the inverter housing may be provided; the terminal protrudes through the slot externally and the seal is wedged between the terminal and the slot periphery.

Alternatively and additionally the seal may be wedged between the terminal (pin/busbar) and two or more inverter components and/or wedged between the two or more invertor components themselves. For example, wedged between the terminal and respective surfaces of the upper and lower ferrite housings and/or the seal may be wedged between respective the upper and lower portions themselves as in FIG. 2c.

In another example the seal is wedged between the terminal and respective surfaces of the upper ferrite housing and a respective surface of the invertor housing (e.g. lower) wall and/or the seal may be wedged between respective the upper ferrite housing portion and a respective surface of the invertor (e.g. lower) wall. Again here a slot in the lower ferrite housing/inverter housing may be provided where the terminal protrudes through the slot externally and the seal is wedged between the terminal and the slot periphery, as well optionally also as the surface of another inverter component. Again the slots may have recessed regions or other mans to provide a neck or shoulder region to assist locating the seal.

Further a further seal/sealing face or cover 16 may be provided additionally.

Figure 2E:
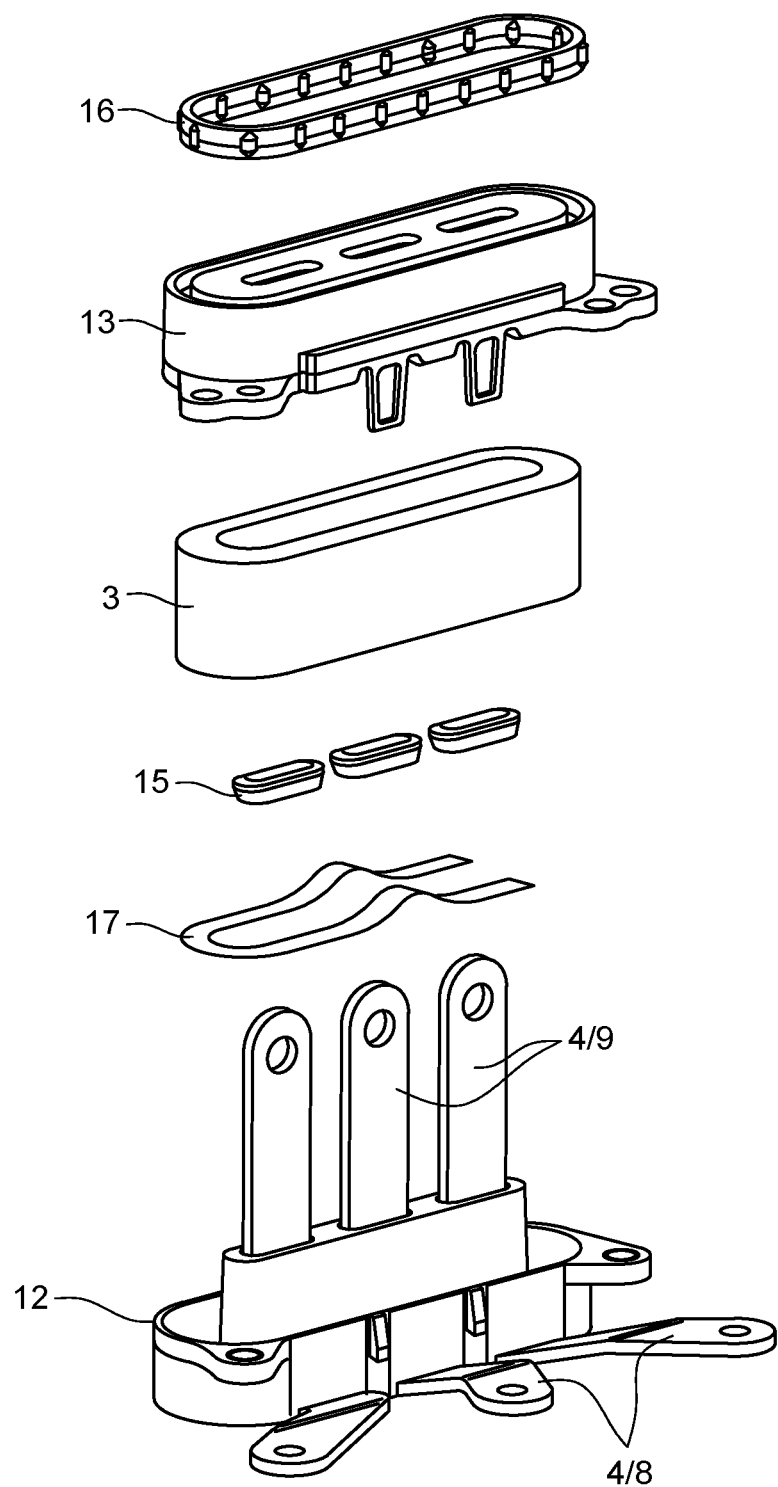

FIG. 2e shows an expanded (exploded) view of the arrangement of FIG. 2a-d. There is provided a compression spring 17 to assist fitting of the core 3. The seal 16 will be compressed during the assembly into the housing by the 3 screws.

Figure 3A:
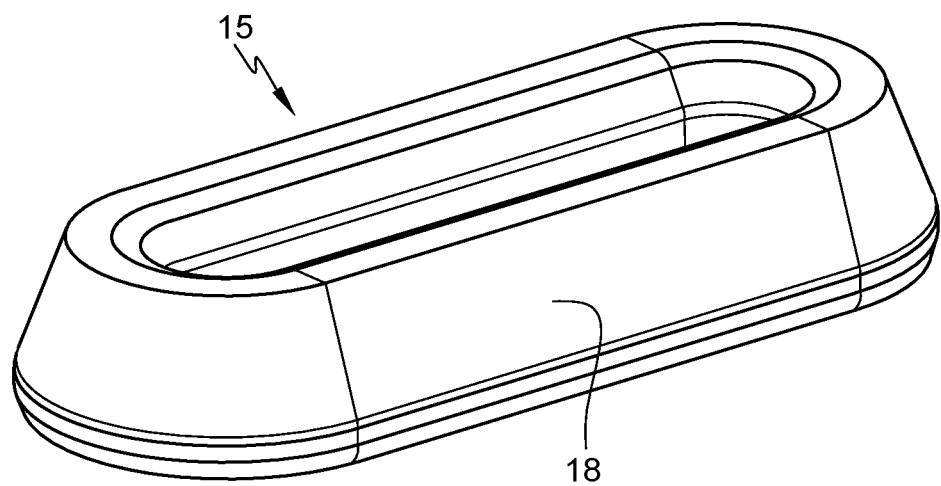
FIGS. 3a and 3b shows a schematic view of a bus bar seal according to one example.
Figure 3B:
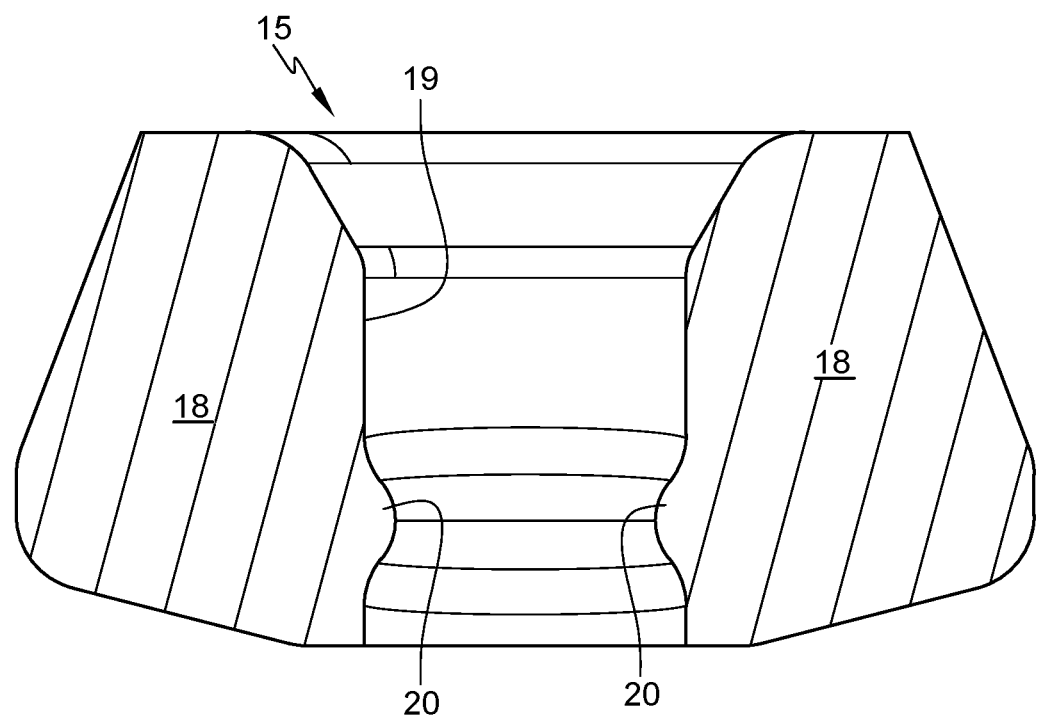

FIGS. 3a and 3b shows a schematic view of the bus bar seal. The seal is a peripheral seal so formed as to general conform to surround the terminal (bus bar or pin). As the bus bars in examples may have a flat rectangular cross section, the seal is correspondingly/appropriately formed such that it or the interior thereof is also generally rectangular; i.e. the internal periphery of the seal is also generally rectangular or elongate.

The seal may be is formed such the wall 18 of the seal (e.g. external surface) is tapered such that along a portion of the seal wall, the thickness of the seal increases in one direction—e.g. towards the bottom. Thus, the cross section of the seal shown in FIG. 3b is of a tapered (or at least part tapered) i.e. conical or part-conical form, i.e. cone formed. This allows good fitting of the seal.

The internal surface 19 of the seal/seal wall may have an internal shoulder or shelf 20, which is peripheral and seen in FIG. 3b as a protrusion. This aids sealing.

The seal in examples may be located sandwiched between either the upper surface of the bottom portion of the inverter (lower) housing 13 or the upper bottom surface of the lower ferrite housing (in the region of the cut-away(s)), and the end (face) of the central portion of the upper ferrite housing 14; and surrounds the bus bar.

As the upper ferrite housing 12 may be connected to the lower housing 13 and/or lower surface of the inverter housing by e.g. tapping and bolt/screw means 21, this will provide a degree of compression to ensure deformation of the seal to provide a good sealing (interfaces). The inner bottom face of the inverter lower housing wall (i.e. the inner surface of the housing wall) or the bottom wall of the of the lower overmould may include a recessed/shelf (peripheral) portion to allow fitting of the seal; the recessed portion may correspond to the shape of the seal.

So in examples is provided a busbar seal with preferred appropriate busbar shape design. The seal is designed to seal a rectangular-shape busbar all around and to seal the plastic all around. The seal meets all specifications (temperature, stack-up & pressure). The busbar can be designed with special shape/deburring process to avoid any damaged to the seal during the assembly. The benefits means customer requirements are achieved as there is no leak. The seal price (0.45€ approx./set) is currently cheaper than dispense material (3€ approx./set). The assembly/arrangement is easy assembly process, shorter assembly cycle time and better-quality control.

The term "wedged between (component X and Y)" can be considered as the GC term "located" and also alternatively that the resilient seal is deformed/under compression between X and Y.

The invention claimed is:

1. A vehicle inverter terminal sealing arrangement comprising: an electrical terminal sealed into an inverter and having a distal portion of said terminal protruding external to said inverter, wherein said terminal is sealed into said inverter by a compression spring, a resilient peripheral seal, and a ferrite core, said peripheral seal surrounding a portion of said terminal, and said peripheral seal being wedged between said terminal and one or more of the compression ring or at least one portion of said inverter.

2. The arrangement as claimed in claim 1, wherein said at least one portion of said inverter includes a cut-away portion or slot through which the terminal protrudes externally, said peripheral seal being wedged between said terminal and the periphery of said cut away portion.

3. The arrangement as claimed in claim 1, wherein said portion of the inverter is an inverter housing.

4. The arrangement as claimed in claim 1, wherein said portion of the inverter is a ferrite core housing or housing component.

5. The arrangement as claimed in claim 1, wherein said terminal is a bus bar or pin of substantially rectangular cross section.

6. The arrangement as claimed in claim 1, wherein said peripheral seal is elongate.

7. The arrangement as claimed in claim 1, wherein said peripheral seal comprises a peripheral wall and such that a thickness of the wall varies or the wall has a portion which has a tapered cross section.

8. The arrangement as claimed in claim 1, wherein said peripheral seal is wedged between said terminal and a first component of said inverter and also between said terminal and a second component of said inverter.

9. The arrangement as claimed in claim 1, wherein said peripheral seal is wedged between a first component and a second component of said inverter.

10. The arrangement as claimed in claim 9, wherein said peripheral seal is wedged between an upper and a lower ferrite core housing.

11. The arrangement as claimed in claim 10, wherein the portion of the upper ferrite core housing where said peripheral seal is wedged is a bottom surface of a central portion of the upper ferrite core housing.

12. The arrangement as claimed in claim 9, wherein said peripheral seal is wedged between the upper ferrite core housing and a portion of an inverter housing wall.

13. The arrangement as claimed in claim 8, wherein at least one or both of said first and second inverter components include a slot portion through which the terminal protrudes, said peripheral seal being wedged between said terminal and the periphery of said cut away portion.

14. The arrangement as claimed in claim 13, wherein any of said slots includes a recess or shoulder to receive or locate said peripheral seal.

15. The arrangement as claimed in claim 14, wherein said recess(es) or shoulder(s) corresponds substantially to said peripheral seal shape.

16. The arrangement as claimed in claim 1, further including the compression spring adapted to wedge, retain, or place said peripheral seal under compression.

17. The arrangement as claimed in claim 16, wherein the compression spring means comprises a spring clip.

18. The arrangement as claimed in claim 10, further including a connector to connect said first invertor component to said second inverter component; said connector acting also to compress said peripheral seal.

19. The arrangement as claimed in claim 1, wherein the compression spring is configured to assist fitting of the core by providing a force in a direction parallel with a longitudinal axis of said terminal.

20. The arrangement as claimed in claim 1, wherein the inverter further includes:
  an upper ferrite core housing, wherein the upper ferrite core housing includes the terminal;
  a lower ferrite core housing to connect to the upper ferrite core housing to surround the compression spring, the resilient peripheral seal, and the ferrite core; and
  a cover to connect to an opposite side of the lower ferrite core housing from the ferrite core.

* * * * *